(12) United States Patent
Zhu et al.

(10) Patent No.: US 12,197,249 B2
(45) Date of Patent: Jan. 14, 2025

(54) FLEXIBLE STRUCTURE, DISPLAY PANEL AND DISPLAY APPARATUS

(71) Applicant: KUNSHAN GO-VISIONOX OPTO-ELECTRONICS CO., LTD, Jiangsu (CN)

(72) Inventors: Kunpeng Zhu, Kunshan (CN); Xiangqian Wang, Kunshan (CN); Chaochi Peng, Kunshan (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 315 days.

(21) Appl. No.: 17/519,066

(22) Filed: Nov. 4, 2021

(65) Prior Publication Data

US 2022/0057838 A1  Feb. 24, 2022

Related U.S. Application Data

(63) Continuation of application No. PCT/CN2020/105069, filed on Jul. 28, 2020.

(30) Foreign Application Priority Data

Nov. 19, 2019 (CN) .......................... 201911096250.9

(51) Int. Cl.
*G02F 1/1362* (2006.01)
*G06F 1/16* (2006.01)
(Continued)

(52) U.S. Cl.
CPC ...... *G06F 1/1652* (2013.01); *G02F 1/136286* (2013.01); *H10K 50/80* (2023.02);
(Continued)

(58) Field of Classification Search
CPC .............. G02F 1/136286; H10K 50/80; H10K 59/131; H10K 77/111; G06F 1/1652
See application file for complete search history.

(56) References Cited

U.S. PATENT DOCUMENTS

| 5,898,213 A | 4/1999 | Torres et al. |
| 5,951,304 A | 9/1999 | Wildes et al. |

(Continued)

FOREIGN PATENT DOCUMENTS

| CN | 202231955 U | 5/2012 |
| CN | 102610584 A | 7/2012 |

(Continued)

OTHER PUBLICATIONS

International Search Report issued on Oct. 12, 2020 in corresponding International Application No. PCT/CN2020/105069; 5 pages.

(Continued)

*Primary Examiner* — James A Dudek
(74) *Attorney, Agent, or Firm* — Maier & Maier, PLLC

(57) ABSTRACT

The flexible structure includes substrate and n rows of first pads arranged on a side of substrate, first pads in each row arranged along a first direction; a virtual extension line of the first pad extends in an oblique direction with respect to a second direction, and virtual extension lines of all first pads intersect at a same convergent point, the first direction is perpendicular to the second direction; at least one equally-divided point is defined in a space between two adjacent first pads in an i-th row; and a central point of each first pad in an (i+1)-th row, a first setting equally-divided point of the at least one equally-divided point, and the convergent point are located on a same straight line, n is integer greater than 1, i is positive integer, i less than n, and m equal to (n−i+1).

14 Claims, 11 Drawing Sheets

(51) Int. Cl.
*H10K 50/80* (2023.01)
*H10K 59/131* (2023.01)
*H10K 77/10* (2023.01)
*H10K 102/00* (2023.01)

(52) U.S. Cl.
CPC ......... *H10K 59/131* (2023.02); *H10K 77/111* (2023.02); *H10K 2102/311* (2023.02)

(56) References Cited

U.S. PATENT DOCUMENTS

| | | | |
|---|---|---|---|
| 9,980,378 | B1 | 5/2018 | Mutnury et al. |
| 2007/0275578 | A1 | 11/2007 | Yamada |
| 2018/0090442 | A1* | 3/2018 | Li .......................... H05K 1/117 |
| 2018/0122758 | A1* | 5/2018 | Chen ................... H01L 27/1218 |
| 2020/0161337 | A1* | 5/2020 | Song ..................... H01L 27/124 |
| 2021/0028263 | A1* | 1/2021 | Tsai ..................... H10K 59/131 |

FOREIGN PATENT DOCUMENTS

| | | |
|---|---|---|
| CN | 105551378 A | 5/2016 |
| CN | 105609007 A | 5/2016 |
| CN | 205376002 U | 7/2016 |
| CN | 205541677 U | 8/2016 |
| CN | 107093592 A | 8/2017 |
| CN | 107346082 A | 11/2017 |
| CN | 108022514 A | 5/2018 |
| CN | 108022516 A | 5/2018 |
| CN | 108183095 A | 6/2018 |
| CN | 108470727 A | 8/2018 |
| CN | 208271902 U | 12/2018 |
| CN | 109410759 A | 3/2019 |
| CN | 109712563 A | 5/2019 |
| CN | 110164919 A | 8/2019 |
| CN | 110689812 A | 1/2020 |
| JP | 2006-276368 A | 10/2006 |
| WO | 2018/080185 A1 | 5/2018 |

OTHER PUBLICATIONS

First Office Action issued on Jan. 22, 2021 in corresponding Chinese Application No. 201911096250.9; 27 pages; Machine translation attached.

Second Office Action issued on Jul. 1, 2021 in corresponding Chinese Application No. 201911096250.9; 15 pages; Machine translation attached.

* cited by examiner

FLEXIBLE STRUCTURE, DISPLAY PANEL AND DISPLAY APPARATUS

CROSS-REFERENCE TO RELATED APPLICATION(S)

This application is a continuation of International Patent Application No. PCT/CN2020/105069, filed Jul. 28, 2020, which claims priority to Chinese Patent Application No. 201911096250.9 filed on Nov. 11, 2019, the disclosures of both of which are incorporated herein by reference in their entireties.

TECHNICAL FIELD

Embodiments of the present application relate to the field of display technologies, for example, to a flexible structure, a display panel, and a display apparatus.

BACKGROUND

As a resolution of a flexible display panel increases, a dimension of a pad in a bonding region of the flexible display panel gradually decreases, and a density of pads in the bonding region gradually increases. Similarly, a dimension of a pad in a flexible structure which correspondingly attached to the bonding region also gradually decreases, and a density of pads in the flexible structure gradually increases. In this manner, when the flexible display panel and the flexible structure are bonded, the flexible display panel and the flexible structure are prone to in a disconnection caused by a misalignment between the pad of the flexible display panel and the pad of the flexible structure.

In addition, a deformation of the flexible display panel and a deformation of the flexible structure during a bending process, as well as a temperature factor and a humidity factor, easily causes misalignment and disconnection between the pad of the flexible display panel and the pad of the flexible structure when the flexible display panel and the flexible structure are bonded, which affects a signal transmission process from the flexible structure to the flexible display panel, and which further affects a normal display of the display panel.

SUMMARY

The present application provides a flexible structure, a display panel, and a display apparatus. In this manner, a probability of disconnection caused by a misalignment of pads can be reduced, and a designing difficulty of first pads in the flexible structure can be reduced while a bonding yield and a bonding reliability of a flexible display panel and the flexible structure can be improved.

In a first aspect, embodiments of the present application provide a flexible structure. The flexible structure includes a substrate and n rows of first pads arranged on a side of the substrate, wherein the first pads in each row are arranged along a first direction.

A virtual extension line of the first pad extends in an oblique direction with respect to a reference line extending along a second direction, and virtual extension lines of all first pads intersect at a same convergent point, wherein the first direction and the second direction are perpendicular to each other.

Each first pad in an (i+1)-th row includes a central point along the first direction, at least one equally-divided point is defined in a space between two adjacent first pads in an i-th row, the at least one equally-divided point divides the space into m parts along the first direction, and the at least one equally-divided point includes a first setting equally-divided point. The central point of the first pad in an (i+1)-th row, the first setting equally-divided point defined in the space between two adjacent first pads in the i-th row and the convergent point are correspondingly located on a same straight line, where n is an integer greater than 1, i is a positive integer, i is less than n, and m is equal to (n−i+1).

In a second aspect, embodiments of the present application provide a display panel. The display panel includes a flexible display substrate and n rows of second pads arranged in a bonding region of the flexible display substrate, and the bonding region is located on a side of the flexible display substrate, wherein the second pads in each row are arranged along a first direction.

A virtual extension line of each second pad extends in an oblique direction with respect to a reference line extending along a second direction, and virtual extension lines of all second pads intersect at a same convergent point, wherein the first direction and the second direction are perpendicular to each other.

Each second pad in an (i+1)-th row includes a central point along the first direction, at least one equally-divided point is defined in a space between two adjacent second pads in an i-th row, the at least one equally-divided point divides the space into m parts along the first direction, and the at least one equally-divided point includes a first setting equally-divided point; the central point of the second pad in an (i+1)-th row, the first setting equally-divided point defined in the space between two adjacent second pads in the i-th row and the convergent point are correspondingly located on a same straight line, where n is an integer greater than 1, i is a positive integer, i is less than n, and m is equal to (n−i+1).

In a third aspect, embodiments of the present application further provide a display apparatus. The display apparatus includes the flexible structure as described in the first aspect and the display panel as described in the second aspect. The flexible structure is bonded to a bonding region of the display panel, and each first pad in the flexible structure is electrically connected to a respective second pad in the bonding region of the display panel.

Embodiments of the present application provide a flexible structure, a display panel, and a display apparatus. The flexible structure includes a substrate and n rows of first pads arranged on a side of the substrate, wherein the first pads in each row are arranged along a first direction. A virtual extension line of each first pad extends in an oblique direction with respect to a reference line extending along a second direction, and virtual extension lines of all first pads intersect at a same convergent point, wherein the first direction and the second direction are perpendicular to each other. Each first pad in an (i+1)-th row includes a central point along the first direction. At least one equally-divided point is defined in a space between two adjacent first pads in an i-th row, the at least one equally-divided point divides the space into m parts along the first direction, and the at least one equally-divided point includes a first setting equally-divided point. The central point of the first pad in an (i+1)-th row, the first setting equally-divided point defined in the space between two adjacent first pads in the i-th row, and the convergent point are correspondingly located on a same straight line, where n is an integer greater than 1, i is a positive integer, i is less than n, and m is equal to (n−i+1). In this manner, a probability of disconnection caused by a misalignment of pads can be reduced, and a designing difficulty of first pads in the flexible structure can be reduced while a bonding yield and a bonding reliability of the flexible display panel and the flexible structure can be improved.

DETAILED DESCRIPTION

Figure 1:
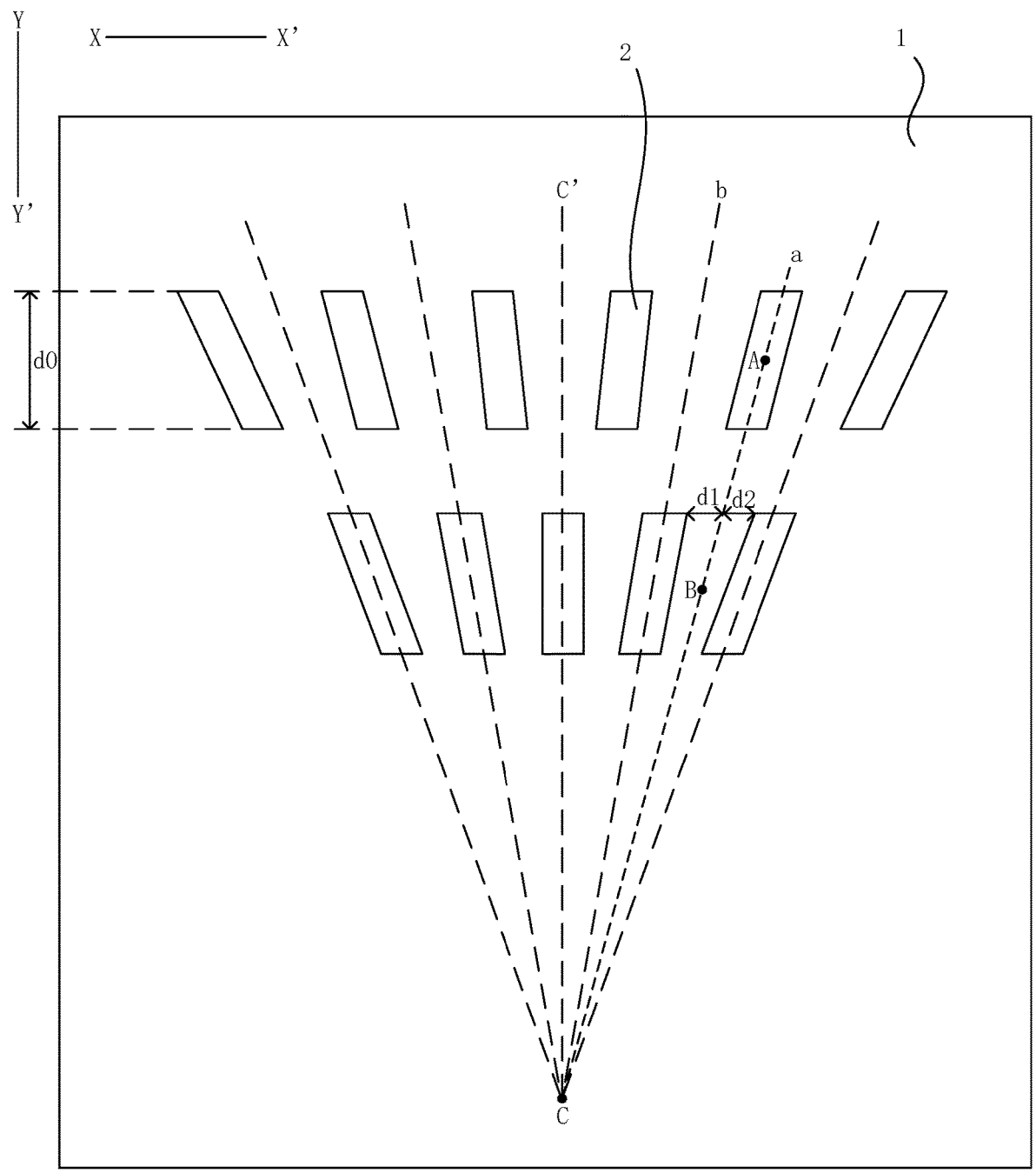
FIG. 1 is a schematic top view of a flexible structure according to an embodiment of the present application.

As a resolution of a flexible display panel increases, a large amount of data needs to be input and output in the flexible display panel, a dimension of a pad in a bonding region of the flexible display panel gradually decrease, and a density of pads gradually increases. Similarly, a dimension of a pad in a flexible structure correspondingly attached to the bonding region also gradually decrease, and a density of pads in the flexible structure gradually increases. When the flexible display panel and the flexible structure are bonded, due to a high density of small dimensional pads, the flexible display panel and the flexible structure are prone to in a disconnection caused by a misalignment between the pad of the flexible display panel and the pad of the flexible structure, so that a signal transmission process from the flexible structure to the flexible display panel is affected. In addition, a deformation of the flexible display panel and a deformation of the flexible structure during a bending process causes the dimensions of the pads and positions of the pads in both the flexible display panel and the flexible structure to change. Moreover, a process under a high temperature and a high pressure is required when the flexible display panel and the flexible structure are bonded, and a polyimide (PI) substrate used in the flexible display panel and the flexible structure is relatively sensitive to temperature and humidity, and the polyimide (PI) substrate may easily shrink or expand. In this manner, when the flexible display panel and the flexible structure are bonded, the flexible display and the flexible structure are prone to in a disconnection caused by a misalignment between the pad of the flexible display panel and the pad of the flexible structure, which affects the signal transmission process from the flexible structure to the flexible display panel, and which further affects a normal display of the display panel.

In embodiments of the present application, a plurality of first pads extending obliquely are provided, virtual extension lines corresponding to the first pads intersect at a same convergent point, and the first pads in each row are dispersedly arranged along a first direction. The relative position of the flexible structure and the flexible display panel along a second direction may be adjusted, so that pads in the flexible display panel accurately corresponds to respective pads in the flexible structure, the probability of disconnection caused by the misalignment of the pads can be reduced, and the bonding yield and the bonding reliability of the flexible display panel and the flexible structure can be improved. At the same time, each first pad in an (i+1)-th row includes a central point along the first direction; At least one equally-divided point is defined in a space between two adjacent first pads in an i-th row, the at least one equally-divided point divides the space into m parts along the first direction, and the at least one equally-divided point includes a first setting equally-divided point. The central point of the first pad in the (i+1)-th row, a first setting equally-divided point defined in the space between two adjacent first pads in the i-th row, and the convergent point are correspondingly located on a same straight line. The central point of each first pad, the at least one equally-divided point defined in the space between two adjacent first pads, and the convergent point are set regularly, which is conducive to reducing the designing difficulty of the first pads in the flexible structure.

FIG. 1 is a schematic top view of a flexible structure according to an embodiment of the present application. As shown in FIG. 1, the flexible structure includes a substrate 1 and n rows of first pads 2 arranged on a side of the substrate 1. The first pads 2 in each row are arranged along a first direction XX'. A virtual extension line of each first pad 2 extends in an oblique direction with respect to a reference line CC' extending along a second direction YY'. Virtual extension lines of all first pads 2 intersect at a same convergent point C. The first direction XX' and the second direction YY' are perpendicular to each other. Each first pad 2 in an (i+1)-th row includes a central point along the first direction XX', at least one equally-divided point is defined in a space between two adjacent first pads in an i-th row, the at least one equally-divided point divides the space into m parts along the first direction XX', the at least one equally-divided point includes a first setting equally-divided point; the central point of the first pad in the (i+1)-th row, the first setting equally-divided point defined in the space between two adjacent first pads in the i-th row and the convergent point C are correspondingly located on a same straight line, where n is an integer greater than 1, i is a positive integer, i is less than n, and m is equal to (n−i+1).

For example, in FIG. 1, n is equal to 2, that is, the flexible structure includes two rows of first pads 2 located on a side of the substrate 1. Each first pad 2 includes the central point in the first direction, the virtual extension line of the first pad 2 may be understood as a line which is parallel to an extending direction of the first pad 2 and passing through the central point of the first pad 2. For ease of description, a row of first pads 2 adjacent to the convergent point C are referred as a first row of first pads 2, a row of first pads 2 away from the convergent point C are referred as a second row of first pads 2. For example, a dashed line a is a virtual extension line of corresponding first pad 2 in the second row, and a dashed line b is a virtual extension line of the corresponding first pad 2 in the first row. The virtual extension line of each first pad 2 extends in an oblique direction with respect to the reference line CC' extending along the second direction, that is, the first pad 2 is disposed in an oblique direction with respect to the reference line CC'; the virtual extension lines of all first pads 2 intersect at the same convergent point C, that is, the virtual extension lines of all first pads 2 converge to the same point; and the first pads 2 are disposed in an oblique direction with respect to the reference line CC', so that the first pads 2 are well dispersedly arranged along the first direction XX'.

For example, as shown in FIG. 1, i is equal to 1, and each first pad 2 in the second row includes a central point A along the first direction XX', at least one equally-divided point is defined in a space between two adjacent first pads in the first row, the at least one equally-divided point divides the space into m parts along the first direction XX', and the at least one equally-divided point includes a first setting equally-divided point B. When m is equal to (n−i+1), the at least one equally-divided point divides the space into two parts along the first direction XX', and d1 is equal to d2 in FIG. 1. The at least one equally-divided point includes only one equally-divided point, that is a first setting equally-divided point B. So the central point A, the first setting equally-divided point B and the convergent point C are located on the same straight line.

Figure 2:
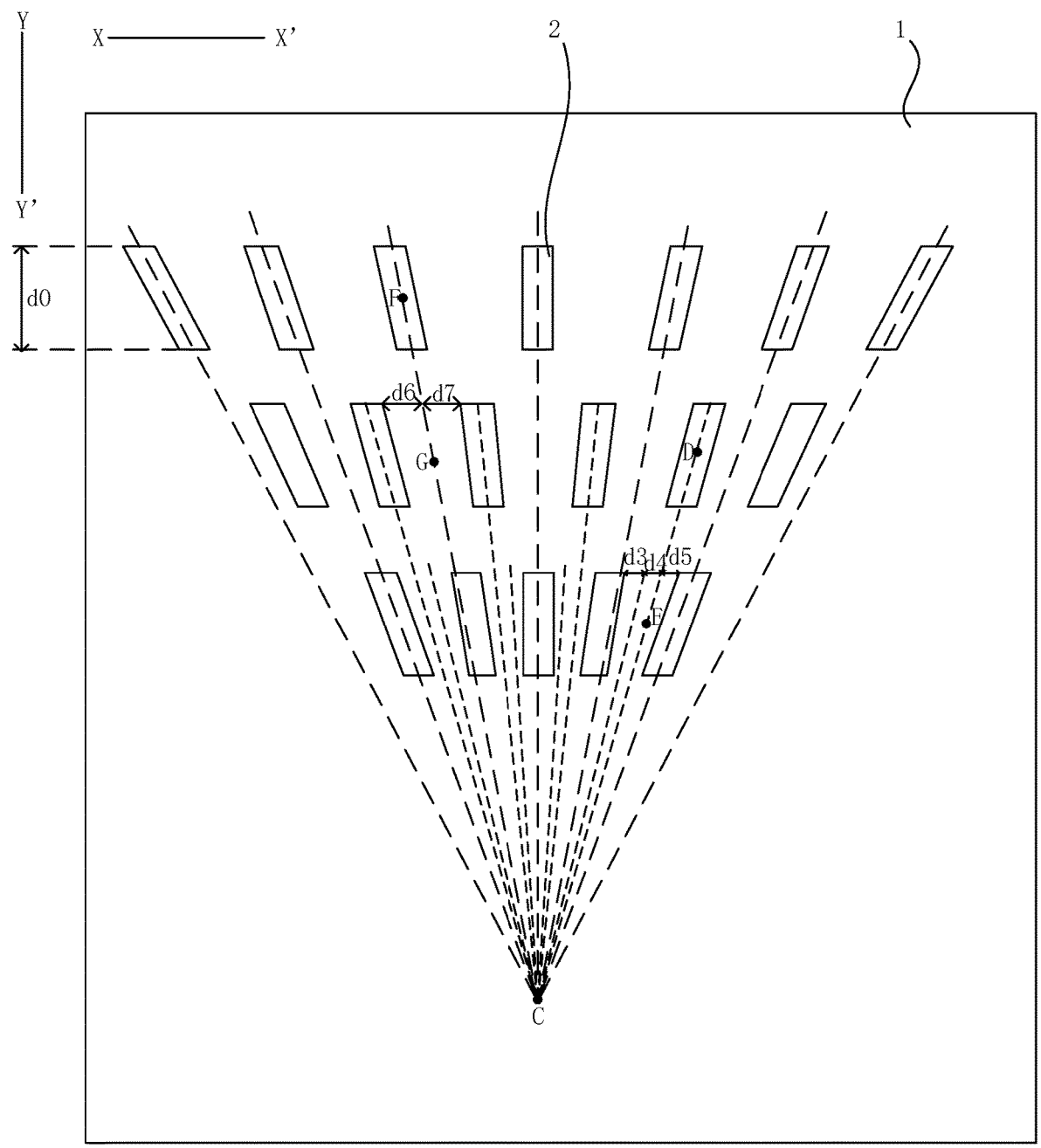
FIG. 2 is a schematic top view of a flexible structure according to another embodiment of the present application.
Figure 3:
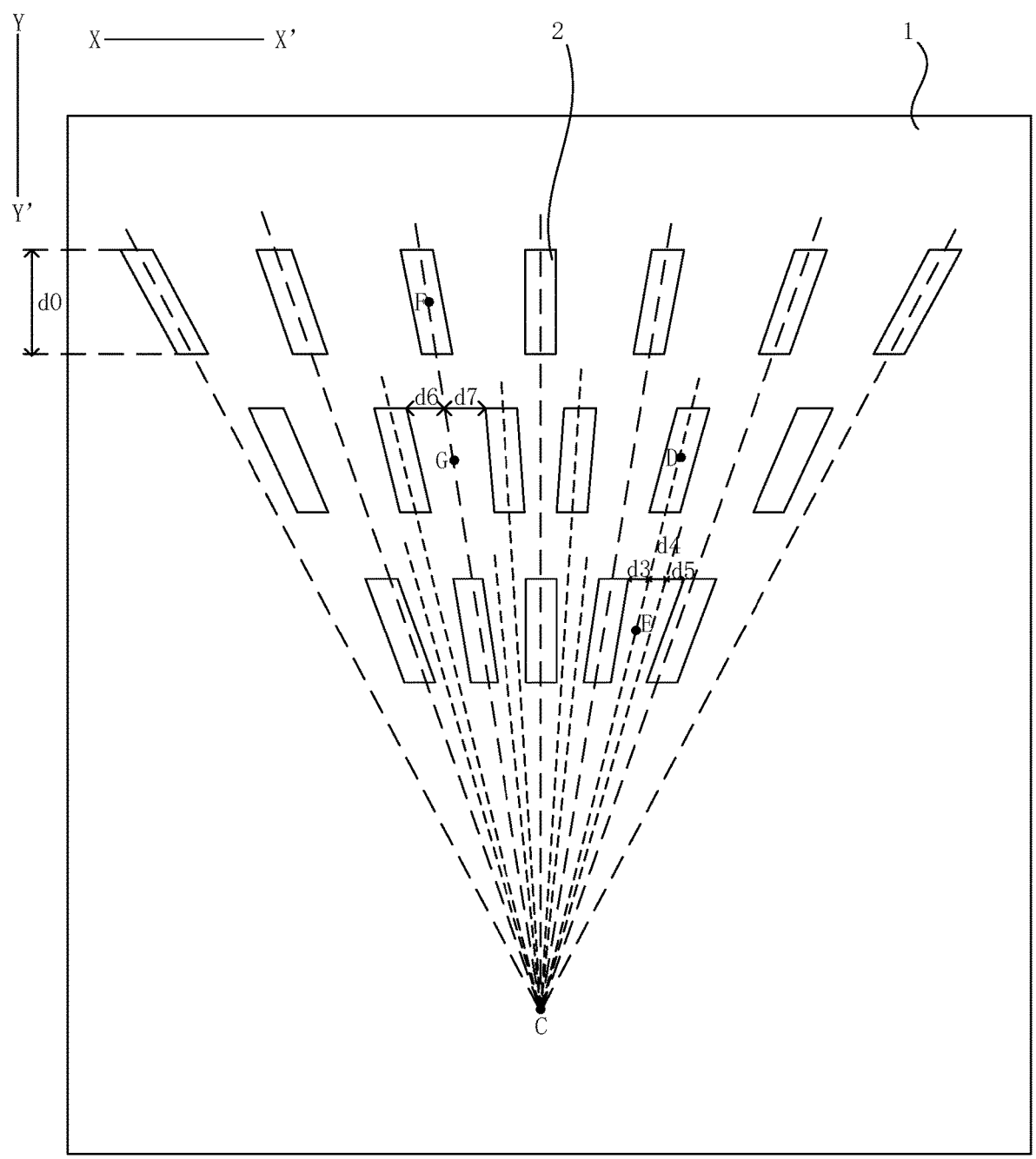
FIG. 3 is a schematic top view of a flexible structure according to another embodiment of the present application.

FIG. 2 is a schematic top view of a flexible structure according to another embodiment of the present application, and FIG. 3 is a schematic top view of a flexible structure according to another embodiment of the present application. Different from the flexible structure shown in FIG. 1, for example, in the flexible structure shown in FIG. 2, n is equal to 3. That is, the flexible structure includes three rows of first pads 2 located on a side of the substrate 1, and a distance between the first pads 2 in the first row and the convergent point C, a distance between the first pads 2 in the second row and the convergent point C, and a distance between the first pads 2 in the third row and the convergent point C are in an ascending order. Each first pad 2 in the (i+1)-th row includes a central point along the first direction XX', at least one equally-divided point is defined in a space between two adjacent first pads in the first row, the at least one equally-divided point divides the space into m parts along the first direction XX', and the at least one equally-divided point includes a first setting equally-divided point. The central point of the first pad 2 in the (i+1)-th row, the first setting equally-divided point defined in the space between two adjacent first pads in the i-th row, and the convergent point C are correspondingly located on a same straight line, the "correspondingly" herein means that the first pad 2 with a central point described above is disposed corresponding to the space between the two adjacent first pads 2, wherein the at least one equally-divided point which divides the space into m parts along the first direction XX' is defined in the space between the two adjacent first pads 2.

When i is equal to 1, each first pad 2 in the second row includes a central point D along the first direction XX', at least one equally-divided point is defined in a space between two adjacent first pads in the first row, the at least one equally-divided point divides the space into m parts along the first direction XX', and the at least one equally-divided point includes the first setting equally-divided point E. When m is equal to (n−i+1), the at least one equally-divided point divides the space into 3 parts along the first direction XX', d3 is equal to d4 which is equal to d5 in FIGS. 2 and 3, the at least one equally-divided point includes only two equally-divided points, and one of the only two equally-divided points may be selected as the first setting equally-divided point. For example, as shown in FIG. 2, one of the only two equally-divided points which is away from the reference line CC' is the first setting equally-divided point; or as shown in FIG. 3, one of the only two equally-divided points which is closer to the reference point CC' is the first setting equally-divided point; and the central point D, the first setting equally-divided point E, and the convergent point C are located on a same straight line. Similarly, when i is equal to 2, each first pad 2 in the third row includes a central point F along the first direction XX', at least one equally-divided point is defined in a space between two adjacent first pads in the second row, the at least one equally-divided point divides the space into m parts along the first direction XX', and the at least one equally-divided point includes the first setting equally-divided point. Since m is equal to (n−i+1), the at least one equally-divided point includes only one equally-divided point which divides the space into 2 parts, d6 is equal to d7 in FIGS. 2 and 3. Since the at least one equally-divided point includes only one equally-divided point which divides the space into 2 parts, the first setting equally-divided point G is the only one equally-divided point which divides the space into 2 parts. The central point F, the first setting equally-divided point G, and the convergent point C are located on a same straight line.

In conjunction with FIGS. 1 to 3, when a dimension of the flexible structure changes along the first direction XX', that is, dimensions of the first pads 2 and positions of the first pads 2 along the first direction XX' change. Since the first pads 2 are all disposed obliquely and the corresponding virtual extension lines of the first pads 2 all intersect at the same convergent point C, the first pads 2 in each row are dispersedly arranged along the first direction XX'. When the flexible display panel and the flexible structure and bonded, a relative position of the flexible structure and the flexible display panel along the second direction YY' may be adjusted and then bonding is performed. In this manner, it is ensured that when the dimensions of the first pads 2 and positions of the first pads 2 along the first direction XX' change within a certain range, the relative position of the flexible structure and the flexible display panel along the second direction YY' may be adjusted so that the pads in the flexible display panel accurately correspond to the respective pads in the flexible structure, a probability of disconnection caused by a misalignment of pads can be reduced, and a bonding yield and a bonding reliability of the flexible display panel and the flexible structure can be improved. At the same time, the central point of each first pad 2 in the (i+1)-th row along the first direction XX', the first setting equally-divided point defined in a space between two adjacent first pads 2 in the i-th row along the first direction XX', and the convergent point C are correspondingly located on the same straight line. The central point of each first pad 2, the equally-divided point defined in the space, and the convergent point C are set regularly, which is conducive to reducing the designing difficulty of first pads 2 in the flexible structure.

In addition, since the first pads 2 are all disposed obliquely and the corresponding virtual extension lines of the first pads 2 all intersect at the same convergent point C, the first pads 2 in each row are well dispersedly arranged along the first direction XX'. That is, for the first pads 2 in the same row, the greater the distance between the first pad 2 and the reference line CC' along the first direction XX' is, the greater the angle between the virtual extension line of the first pad 2 and the reference line CC' is, that is, the less the distance between the first pad 2 and an edge position of the flexible structure along the first direction XX' is, the greater the inclination angle of the first pad 2 is. When the flexible display panel is stressed, an edge area of the flexible display panel is more susceptible to a dimensional change than a central region of the flexible display panel, that is, an edge area of the flexible display panel is more susceptible to a deformation than a central region of the flexible display panel. The inclination angle of the first pad 2 closer to the edge position of the flexible structure along the first direction XX' is greater than the inclination angle of the first pad 2 away from the edge position of the flexible structure along the first direction XX', which is conducive to adjusting the relative position of the flexible structure and the flexible display panel along the second direction YY' to improve the alignment accuracy of the pads disposed at the edge positions of the flexible structure and the flexible display panel, to reduce a probability of disconnection caused by a misalignment of pads, and to improve a bonding yield and a bonding reliability of the flexible display panel and the flexible structure.

In some embodiments, in conjunction with FIGS. 1 to 3, along the first direction XX', the first pads 2 in each row may be symmetrically arranged relative to the reference line CC'. For example, for a row of first pads 2, the reference line CC' may be provided with the first pads 2. For example, for the first pads 2 in the first row in FIG. 1, the first pads 2 in the first row located on the left side of the reference line CC' and the right side of the reference line CC' may be symmetrically arranged relative to a central first pad 2 located at the reference line CC'. For a row of first pads 2, the reference line CC' may alternatively not be provided with the first pads 2. For example, for the first pads 2 in the second row in FIG. 1, the first pads 2 in the second row located on the left side of the reference line CC' and the right side of the reference line CC' may be symmetrically arranged relative to the reference line CC', so that the designing difficult of the first pads 2 in the flexible structure can be reduced.

In some embodiments, in conjunction with FIGS. 1 and 3, the first pads 2 each has a length along the second direction YY', lengths d0 of the first pads 2 in the same row may be the same. For example, when the dimension of the flexible structure changes along the first direction XX', that is, the dimensions of the first pads 2 and the positions of the first pads 2 along the first direction XX' change, when the flexible display panel and the flexible structure are bonded, the relative position of the flexible structure and the flexible display panel along the second direction YY' is adjusted. In a case that the lengths d0 of the first pads 2 in the same row are different, when the relative position of the flexible display panel and the flexible structure is adjusted along the second direction YY', a row of first pads 2 with different lengths have different allowable margins for avoiding disconnection caused by misalignment. In this manner, when the relative position of the flexible display panel and the flexible structure is adjusted along the second direction YY', a part of the first pads 2 are adjusted to positions where disconnection does not exist, and a part of the first pads 2 are not adjusted to positions where disconnection does not exist, so that the difficulty in adjusting the relative position of the flexible display panel and the flexible structure along the second direction YY' to avoid the problem of disconnection when the flexible display panel and the flexible structure are bonded increases.

In embodiments of the present application, each first pad 2 has a length along the second direction, and lengths of the first pads 2 in a same row are the same. When the relative position of the flexible display panel and the flexible structure is adjusted along the second direction YY', a row of first pads 2 with same length have a same allowable margin for avoiding disconnection caused by misalignment. In this manner, the probability that the first pad 2 is adjusted synchronously to positions where disconnection does not exist when the relative position of the flexible display panel and the flexible structure is adjusted along the second direction YY' can be improved, so that the difficulty in adjusting the relative position of the flexible display panel and the flexible structure along the second direction YY' to avoid the problem of disconnection when the flexible display panel and the flexible structure are bonded can be reduced.

In some embodiments, with reference to FIGS. 1 to 3, the flexible structure may include at least one chip on film (COF), a driver integrated circuit chip (IC) that drives the display panel may be disposed in the at least one COF. The at least one COF is bonded to a bonding region of the display panel, the shapes of the first pads 2 and the arranging positions of the first pads 2 in the at least one COF are set, and the relative position of the at least one COF and the flexible display panel along the second direction YY' is adjusted. In this manner, the pads in the flexible display panel accurately correspond to the respective pads in the at least one COF, a probability of disconnection caused by a misalignment of pads can be reduced, and a bonding yield and a bonding reliability of the flexible display panel and the at least one COF can be improved; at the same time, the central point of each first pad 2, the equally-divided point defined in the space, and the convergent point are set regularly, which is conducive to reducing the designing difficulty of first pads 2 in the at least one COF.

In some embodiments, with reference to FIGS. 1 to 3, the flexible structure may also include at least one flexible printed circuit board (FPCB), the at least one FPCB is bonded to the bonding region of the display panel, the shapes of the first pads 2 and the arranging positions of the first pads 2 in the at least one FPCB are set, and the relative position of the at least one FPCB and the flexible display panel along the second direction YY' is adjusted. In this manner, the pads in the flexible display panel accurately correspond to the respective pads in the at least one FPCB, a probability of disconnection caused by a misalignment of pads can be reduced, and a bonding yield and a bonding reliability of the flexible display panel and the at least one FPCB can be improved; at the same time, the central point of each first pad 2, the equally-divided point defined in the space, and the convergent point are set regularly, which is conducive to reducing the designing difficulty of the first pads 2 in the at least one FPCB.

Figure 4:
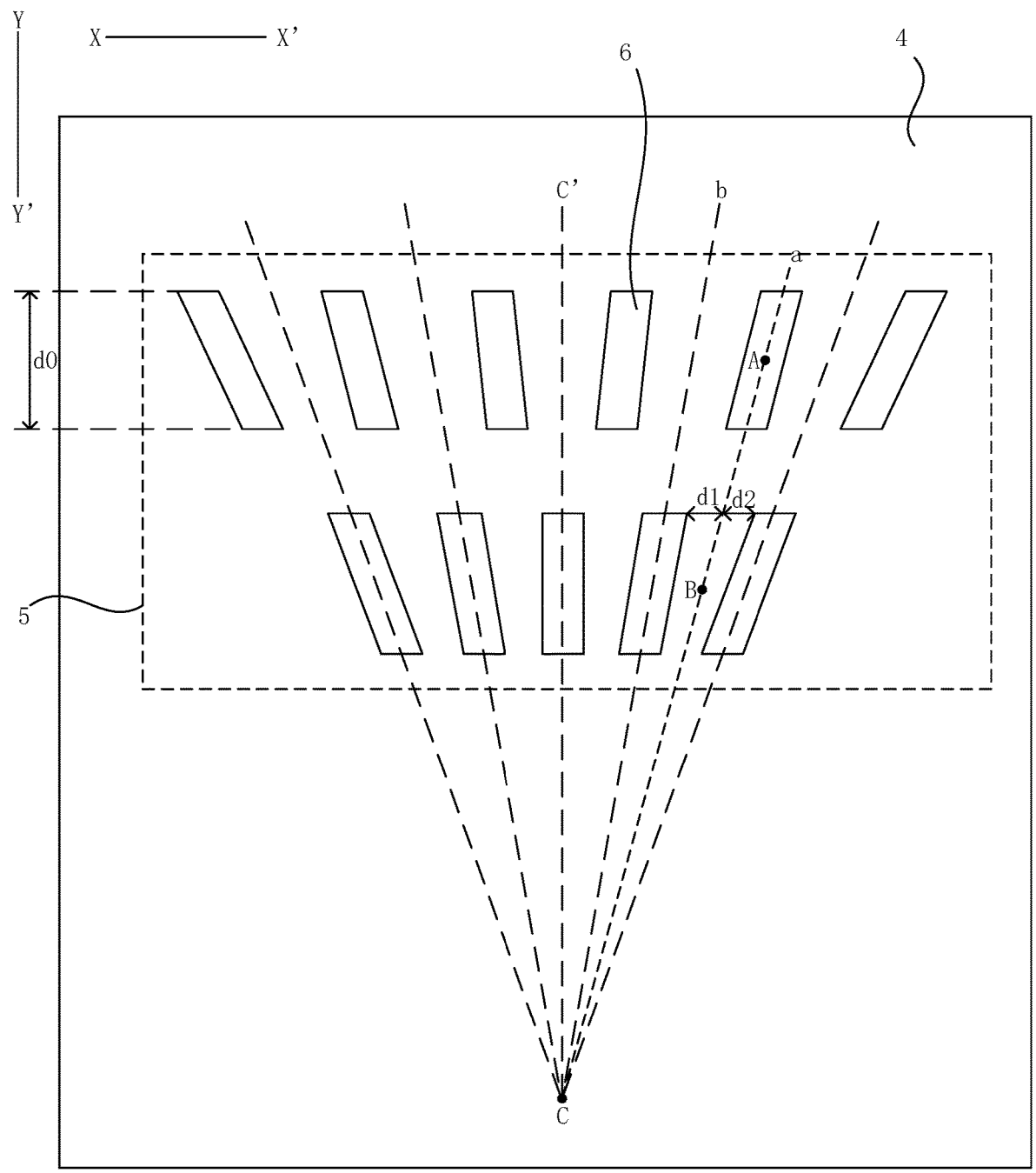
FIG. 4 is a schematic top view of a display panel according to an embodiment of the present application.

Embodiments of the present application further provide a display panel. FIG. 4 is a schematic top view of a display panel according to an embodiment of the present application. As shown in FIG. 4, the display panel includes a flexible display substrate 4 and n rows of second pads 6 disposed in a bonding region 5 of the flexible display panel 4, and the bonding region 5 is located on a side of the flexible display panel 4, the second pads 6 in each row are arranged along the first direction XX', a virtual extension line of each second pad 6 extends in an oblique direction with respect to a reference line CC' that is extending along the second direction YY', virtual extension lines of all second pads 6 intersect at the same convergent point C, and the first direction XX' and the second direction YY' are perpendicular to each other. Each second pad 6 in an (i+1)-th row comprises a central point along the first direction XX', at least one equally-divided point is defined in a space between two adjacent second pads in an i-th row, the at least one equally-divided point divides the space into m parts along the first direction, and the at least one equally-divided point includes a first setting equally-divided point. The central point of the second pad in the (i+1)-th row, the first setting equally-divided point defined in the space between two adjacent second pads in an i-th row and the convergent point C are correspondingly located on the same straight line, where n is an integer greater than 1, i is a positive integer, i is less than n, and m is equal to (n−i+1).

For example, in FIG. 4, n is equal to 2, that is, the display panel includes two rows of second pads 6 on a side of the flexible display substrate 4, each second pad 6 includes the central point in the first direction, and the virtual extension line of the second pad 6 may be understood as a line which is parallel to an extending direction of the second pad 6 and passing through a central point of the second pad 6. For ease of description, a row of second pads 6 adjacent to the convergent point C are referred as a first row of second pads 6, and a row of second pads 6 away from the convergent point C are referred as a second row of second pads 6. For example, a dashed line a is a virtual extension line of the corresponding second pad 6 in the second row, and a dashed line b is a virtual extension line of the corresponding second pad 6 in the first row. The virtual extension line of each second pad 6 extends in an oblique direction with respect to the reference line CC' extending along the second direction, that is, the second pad 6 is disposed in an oblique direction with respect to the reference line CC'. The virtual extension lines of all second pads 6 intersect at the same convergent point C, that is, the virtual extension lines of all second pads 6 converge to a same point. The second pads 6 are disposed in an oblique direction with respect to the reference line CC', so that the second pads 6 are well dispersedly arranged along the first direction XX'.

For example, as shown in FIG. 4, i is equal to 1, then each second pad 6 in the second row includes a central point A along the first direction XX', at least one equally-divided point is defined in a space between two adjacent second pads 6 in the first row, the at least one equally-divided point divides the space into m parts along the first direction XX', the at least one equally-divided point includes a first setting equally-divided point B. Since m is equal to (n−i+1), the at least one equally-divided point divides the space into two parts along the first direction XX', and d1 is equal to d2 in FIG. 8. The at least one equally-divided point includes only one equally-divided point, that is a first setting equally-divided point B. So the central point A, the first setting equally-divided point B and the convergent point C are located on the same straight line.

Figure 5:
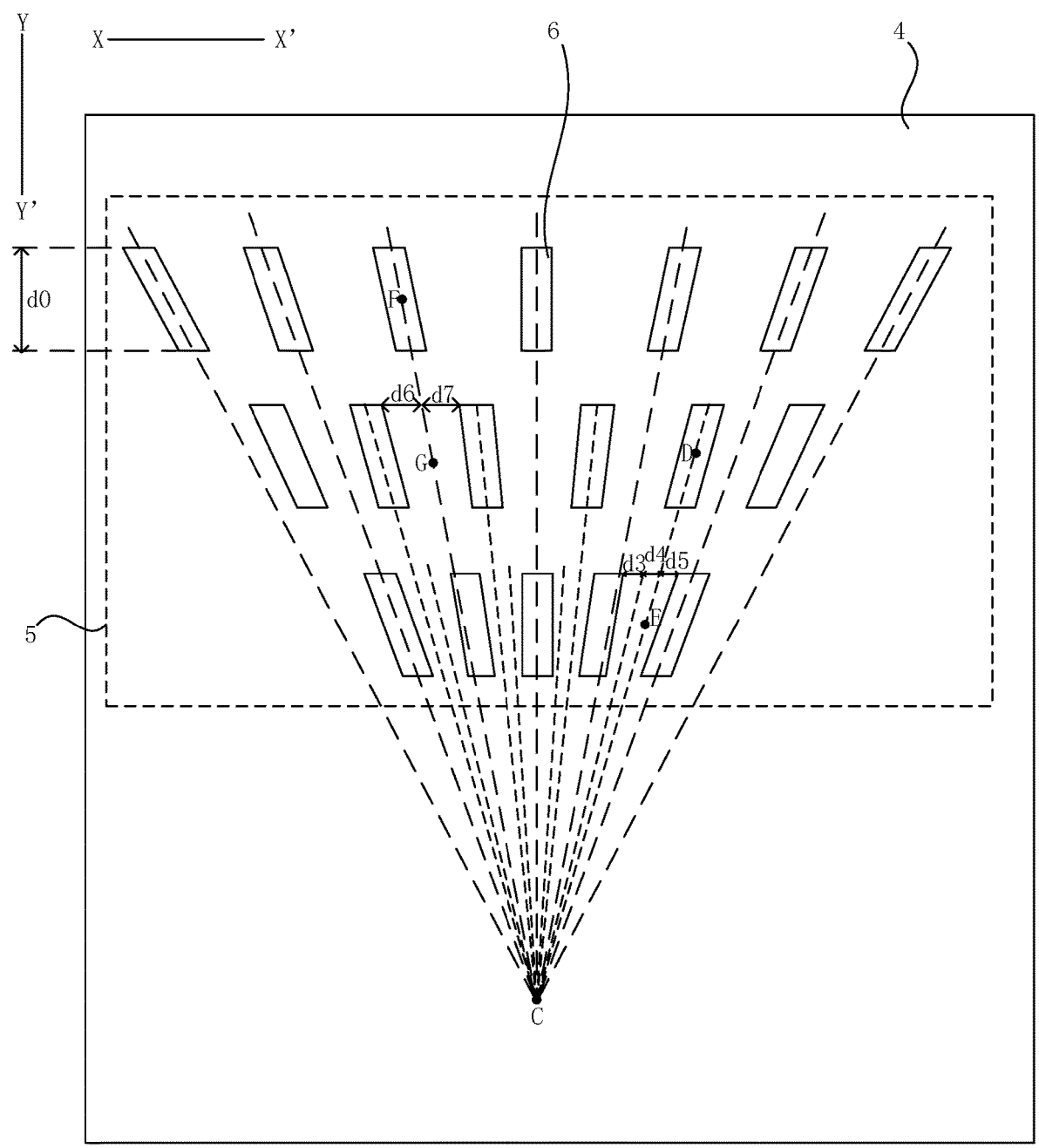
FIG. 5 is a schematic top view of a display panel according to another embodiment of the present application.
Figure 6:
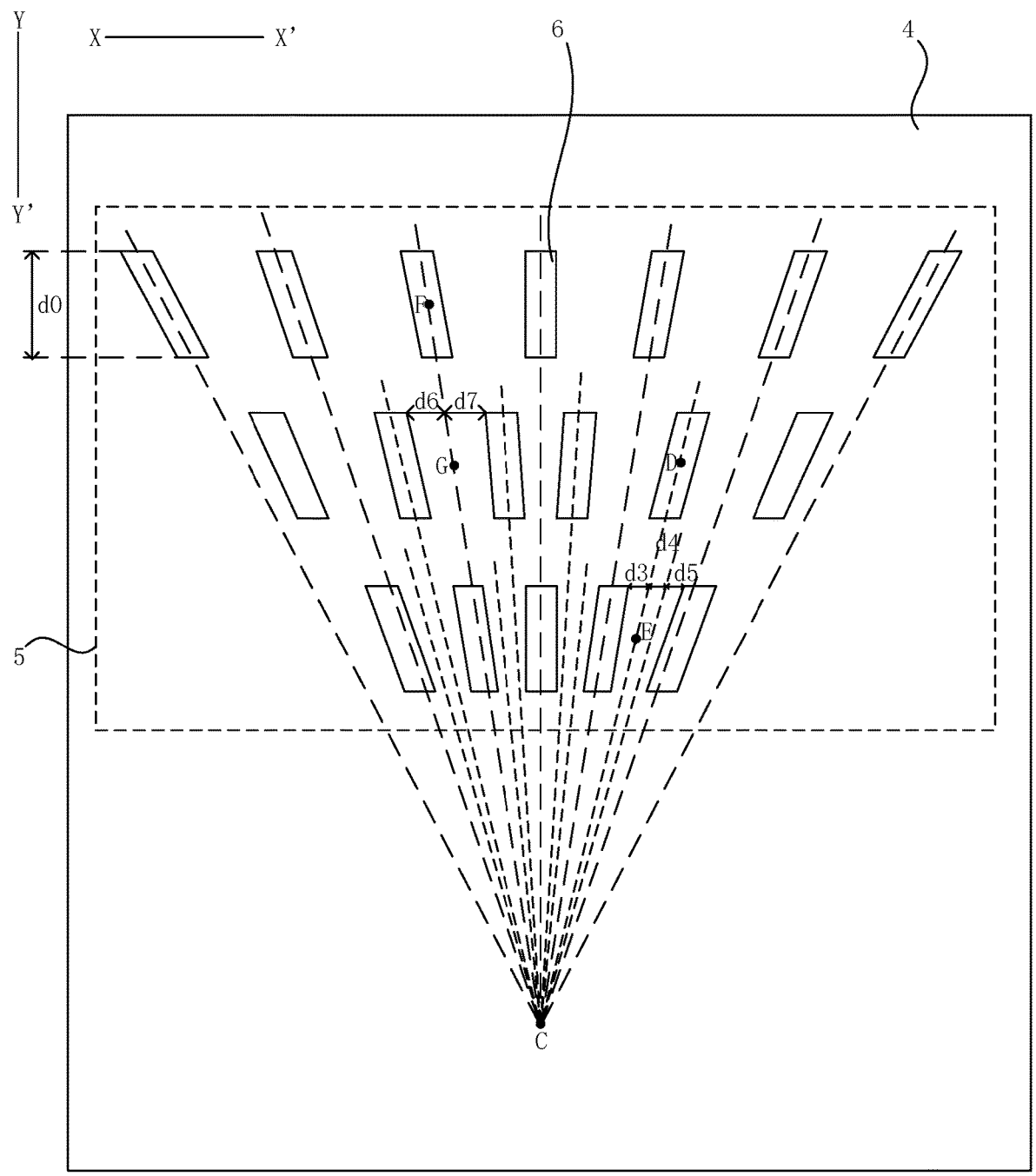
FIG. 6 is a schematic top view of a display panel according to another embodiment of the present application.

FIG. 5 is a schematic top view of a display panel according to another embodiment of the present application, and FIG. 6 is a schematic top view of a display panel according to another embodiment of the present application. Different from the display panel shown in FIG. 4, for example, in the display panel shown in FIGS. 5 and 6, n is equal to 3, that is, the display panel includes three rows of second pads 6 on a side of the flexible display substrate 4, and a distance between the second pads 6 in the first row and the convergent point C, a distance between the second pads 6 in the second row and the convergent point C, and a distance between the second pads 6 in the third row and the convergent point C are in an ascending order. Each second pad 6 in the (i+1)-th row includes a central point along the first direction XX', at least one equally-divided point is defined in a space between two adjacent second pads in the first row, the at least one equally-divided point divides the space into m parts along the first direction XX', and the at least one equally-divided point includes the first setting equally-divided point. The central point of the second pad 6 in the (i+1)-th row, the first setting equally-divided point defined in the space between two adjacent second pads in the i-th row, and the convergent point C are correspondingly located on a same straight line, the "correspondingly" herein means that the second pad 6 with a central point described above is disposed corresponding to the space between two adjacent second pads 6, wherein the at least one equally-divided point which divides the space into m parts along the first direction XX' is defined in the space between the two adjacent first pads 2.

When i is equal to 1, each second pad 6 in the second row includes a central point D along the first direction XX', at least one equally-divided point is defined in a space between two adjacent second pads 6 in the first row, the at least one equally-divided point divides the space into m parts along the first direction XX', and the at least one equally-divided point includes the first setting equally-divided point E. Since m is equal to (n−i+1), the at least one equally-divided point divides the space into three parts along the first direction XX', d3 is equal to d4 which is equal to d5 in FIGS. 5 and 6, the at least one equally-divided point includes only two equally-divided points, and one of the only two equally-divided points may be selected as the first setting equally-divided point. For example, as shown in FIG. 5, one of the only two equally-divided points which is away from the reference line CC' is the first setting equally-divided point; or as shown in FIG. 6, one of the only two equally-divided points which is closer to the reference point CC' is the first setting equally-divided point. The central point D, the first setting equally-divided point E, and the convergent point C are located on a same straight line. Similarly, when i is equal to 2, each second pad 6 in the third row includes a central point F along the first direction XX', at least one equally-divided point is defined in a space between two adjacent second pads in the second row, the at least one equally-divided point divides the space into m parts along the first direction XX', and the at least one equally-divided point includes the first setting equally-divided point. Since m is equal to (n−i+1), the at least one equally-divided point includes only one equally-divided point which divides the space into two parts, and d6 is equal to d7 in FIGS. 5 and 6. Since the at least one equally-divided point includes only one equally-divided point which divides the space into two parts, the first setting equally-divided point G is the only one equally-divided point which divides the space into two parts. The central point F, the first setting equally-divided point G, and the convergent point C are located on a same straight line.

In conjunction with FIGS. 4 to 7, when the dimension of the display panel changes along the first direction XX', that is, the dimensions of the second pads 6 and the positions of the second pads 6 along the first direction XX' change. Since the second pads 6 are all disposed obliquely and the corresponding virtual extension lines of the second pads 6 all intersect at the same convergent point C. the second pads 6 in each row are well dispersedly arranged along the first direction XX'. When the flexible display panel and the flexible structure are bonded, the relative position of the flexible structure and the flexible display panel along the second direction YY' may be adjusted before the bonding is performed. In this manner, it is ensured that when the dimensions of the second pads 6 and the positions of the second pads 6 along the first direction XX' change within a certain range, the relative position of the flexible structure and the flexible display panel along the second direction YY' may be adjusted so that the pads in the flexible display panel accurately correspond to the respective pads in the flexible structure, a probability of disconnection caused by a misalignment of pads can be reduced, and a bonding yield and a bonding reliability of the flexible display panel and the flexible structure can be improved. At the same time, the central point of each second pad 6 in the (i+1)-th row along the first direction XX', the first setting equally-divided point defined in a space between two adjacent second pads 6 in the i-th row along the first direction XX', and the convergent point C are correspondingly located on a same straight line. The central point of each second pad 6, the equally-divided point defined in the space, and the convergent point C are set regularly, which is conducive to reducing the designing difficulty of second pads 6 in the flexible display panel and reducing the wiring difficulty of signal transmission lines 7 electrically connected to the second pads 6.

In addition, since the second pads 6 are all disposed obliquely and the corresponding virtual extension lines of the second pads 6 all intersect at the same convergent point C, the second pads 6 in each row are well dispersedly arranged along the first direction XX'. That is, for the second pads 6 in the same row, the greater the distance between the second pad 6 and the reference line CC' along the first direction XX' is, the greater the angle between the virtual extension line of the second pad 6 and the reference line CC' is. That is, the less the distance between the second pad 6 and an edge position of the display panel along the first direction XX' is, the greater the inclination angle of the second pad 6 is. When the flexible display panel is stressed, an edge area of the flexible display panel is more susceptible to a dimensional change than a central region of the flexible display panel, that is, an edge area of the flexible display panel is more susceptible to a deformation than a central region of the flexible display panel. The inclination angle of the second pad 6 closer to the edge position of the display panel along the first direction XX' is greater than the inclination angle of the second pad 2 away from the edge position of the display panel along the first direction XX', which is conducive to adjusting the relative position of the display panel and the flexible display panel along the second direction YY' to improve the alignment accuracy of the pads disposed at the edge positions of the flexible structure and the flexible display panel, to reduce a probability of disconnection caused by a misalignment of pads, and to improve a bonding yield and a bonding reliability of the flexible display panel and the flexible structure.

In some embodiments, in conjunction with FIGS. 4 to 7, along the first direction XX', the second pads 6 in each row may be symmetrically arranged relative to the reference line CC'. For example, for a row of second pads 6, the reference line CC' may be provided with the second pads 6. For example, for the second pads 6 in the first row in FIG. 4, the second pads 6 in the first row on the left side of the reference line CC' and the right side of the reference line CC' may be symmetrically arranged relative to a central second pad 6 located at the reference line CC'. For a row of second pads 6, the reference line CC' may alternatively not be provided with the second pads 6. For example, for the second pads 6 in the second row in FIG. 4, the second pads 6 in the second row located on the left side of the reference line CC' and the right side of the reference line CC' may be symmetrically arranged relative to the reference line CC', so that the designing difficulty of second pads 6 in the display panel and the wiring difficulty of signal transmission lines 7 electrically connected to the second pads 6 can be reduced.

In some embodiments, in conjunction with FIGS. 4 and 6, the second pads 6 each has a length along the second direction YY', lengths d0 of the second pads 6 in a same row may be same. For example, when the dimension of the display panel changes along the first direction XX', that is, the dimensions of the second pads 6 and the positions of the second pads 6 along the first direction XX' change, when the flexible display panel and the flexible structure are bonded, the relative position of the flexible structure and the flexible display panel along the second direction YY' is adjusted. In a case that the lengths d0 of the second pads 6 in the same row are different, when the relative position of the flexible display panel and the flexible structure is adjusted along the second direction YY', a row of second pads 6 with different lengths have different allowable margins for avoiding disconnection caused by misalignment. In this manner, when the relative position of the flexible display panel and the flexible structure is adjusted along the second direction YY', a part of the second pads 6 are adjusted to positions where disconnection does not exist, and a part of the second pads 6 are not adjusted to positions where disconnection does not exist, which increases the difficulty in adjusting the relative position of the flexible display panel and the flexible structure along the second direction YY' to avoid the problem of disconnection when the flexible display panel and the flexible structure are bonded.

In embodiments of the present application, each second pad 6 has a length along the second direction YY', and lengths of the second pads 6 in a same row are same. When the relative position of the flexible display panel and the flexible structure is adjusted along the second direction YY', a row of second pads 6 with same length have same allowable margin for avoiding disconnection caused by misalignment. In this manner, the probability that the second pad 6 is adjusted synchronously to positions where disconnection does not exist when the relative position of the flexible display panel and the flexible structure is adjusted along the second direction YY' can be improved, so that the difficulty in adjusting the relative position of the flexible display panel and the flexible structure along the second direction YY' to avoid the problem of disconnection when the flexible display panel and the flexible structure are bonded can be reduced.

Figure 7:
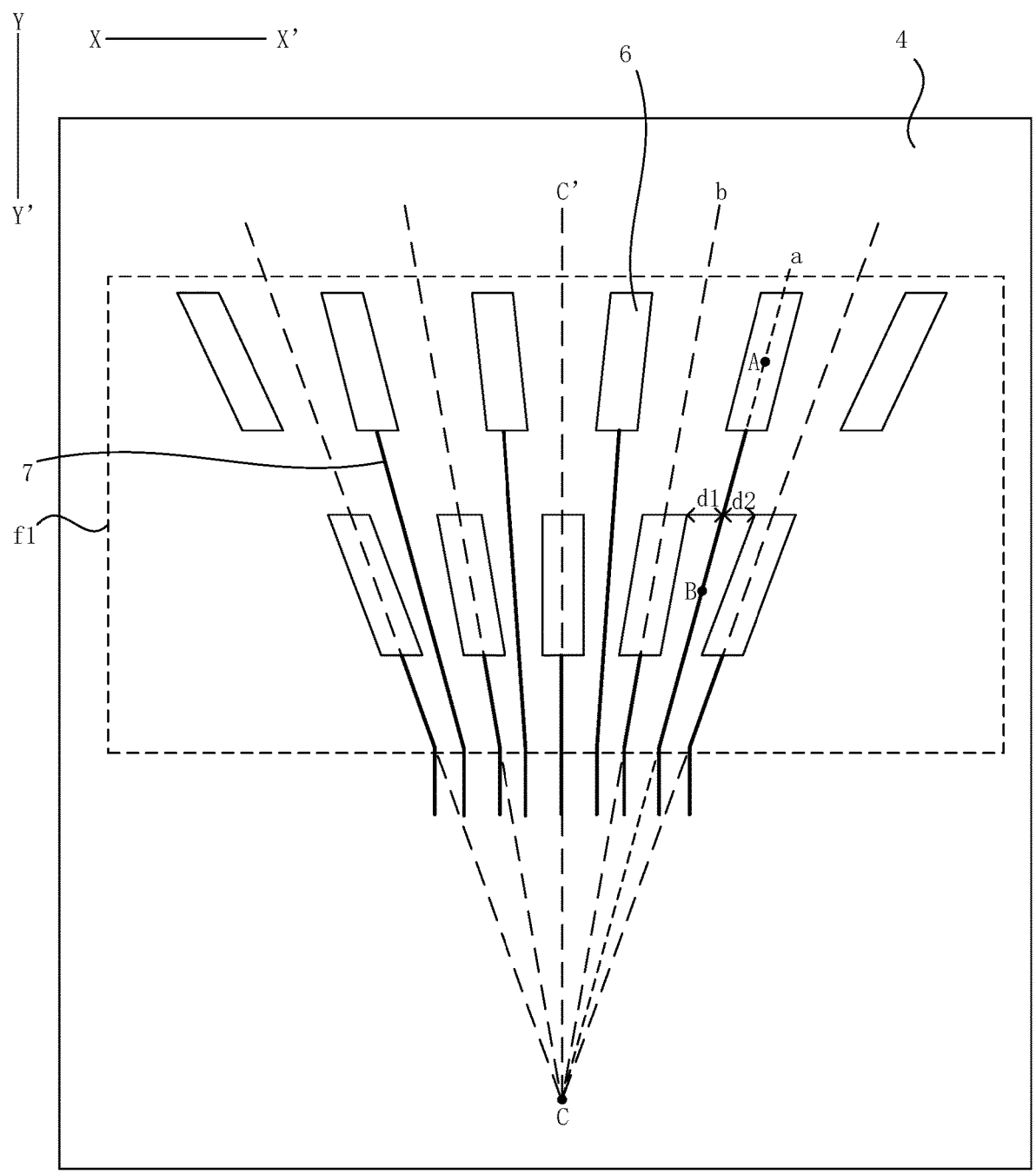
FIG. 7 is a schematic top view of second pads in a display panel and signal transmission lines electrically connected thereto according to an embodiment of the present application.
Figure 8:
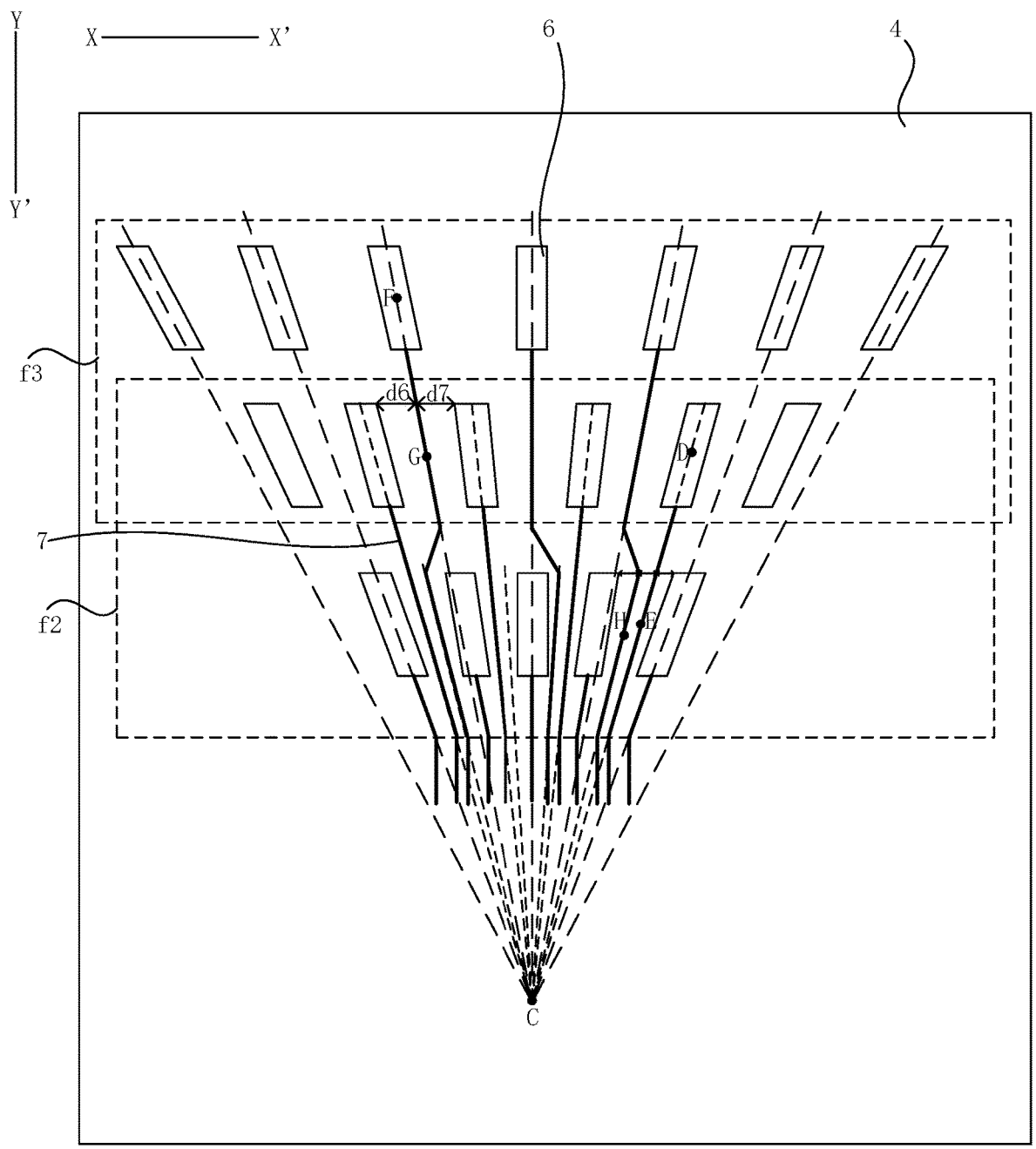
FIG. 8 is a schematic top view of second pads in a display panel and signal transmission lines electrically connected thereto according to another embodiment of the present application.
Figure 9:
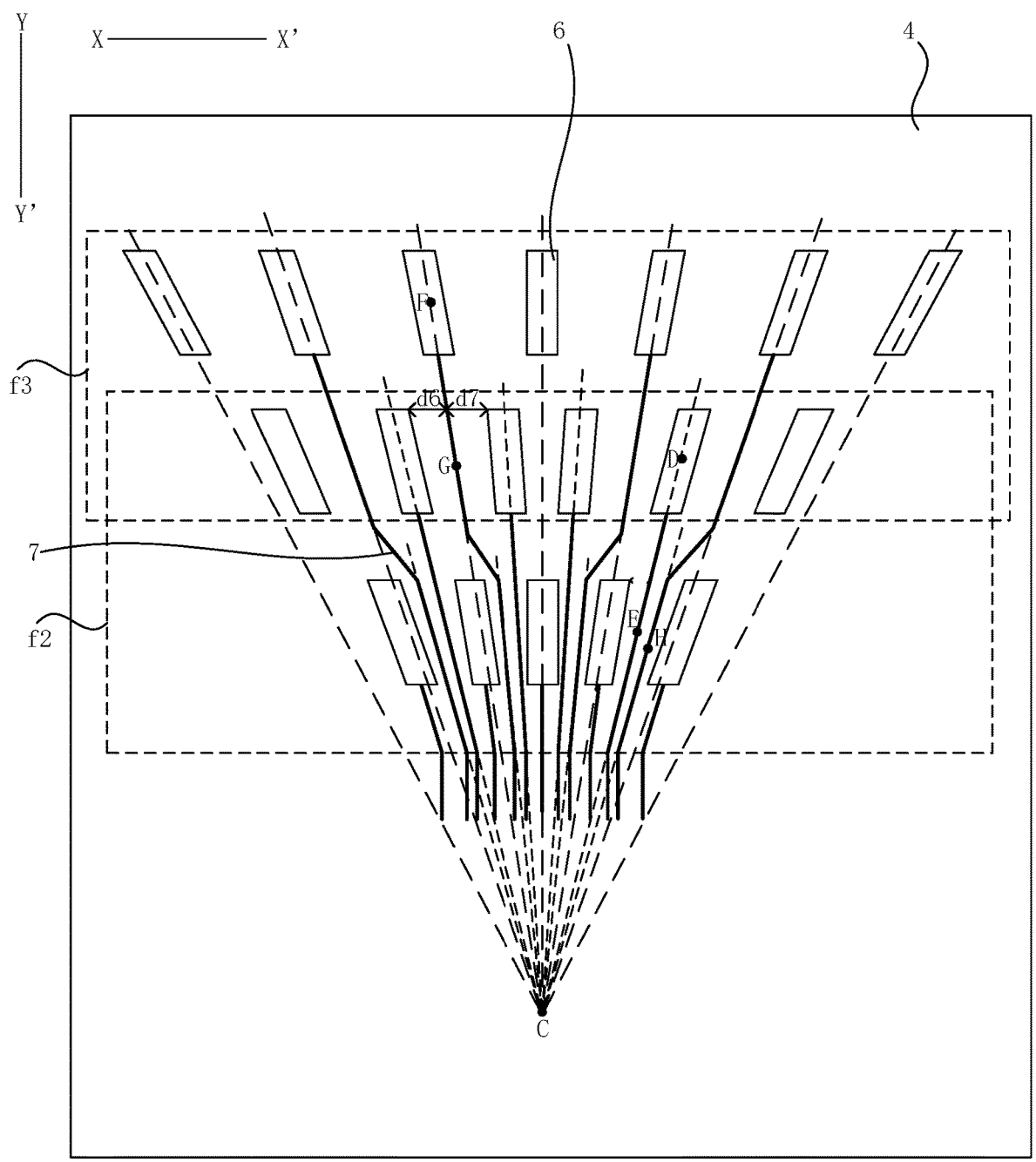
FIG. 9 is a schematic top view of second pads in a display panel and signal transmission lines electrically connected thereto according to another embodiment of the present application.

FIG. 7 is a schematic top view of second pads in a display panel and signal transmission lines electrically connected thereto according to an embodiment of the present application, FIG. 8 is a schematic top view of second pads in a display panel and signal transmission lines electrically connected thereto according to another embodiment of the present application, and FIG. 9 is a schematic top view of second pads in a display panel and signal transmission lines electrically connected thereto according to another embodiment of the present application, wherein FIG. 7 corresponds to the arrangement of the second pads 6 in FIG. 4, FIG. 8 corresponds to the arrangement of the second pads 6 in FIG. 5, and FIG. 9 corresponds to the arrangement of the second pads 6 in FIG. 6. In conjunction with FIGS. 4 to 9, in a distribution region between the second pads 6 in the (i+1)-th row and the second pads 6 in the i-th row along the second direction YY', signal transmission lines 7 electrically connected to the second pads 6 in the (i+1)-th row are straight lines.

For example, in conjunction with FIGS. 4 and 7, i is equal to 1, in a distribution region f1 between the second pads 6 in the second row and the second pads 6 in the first row along the second direction YY', signal transmission lines 7 electrically connected to the second pads 6 in the second row are straight lines. In conjunction with FIGS. 8 and 9, when i is equal to 1, in a distribution region f2 between the second pads 6 in the second row and the second pads 6 in the first row along the second direction YY', signal transmission lines 7 electrically connected to the second pads 6 in the second row are straight lines. When i is equal to 2, in a distribution region f3 between the second pads 6 in the third row and the second pads 6 in the second row along the second direction YY', signal transmission lines 7 electrically connected to the second pads 6 in the third row are straight lines.

Figure 10:
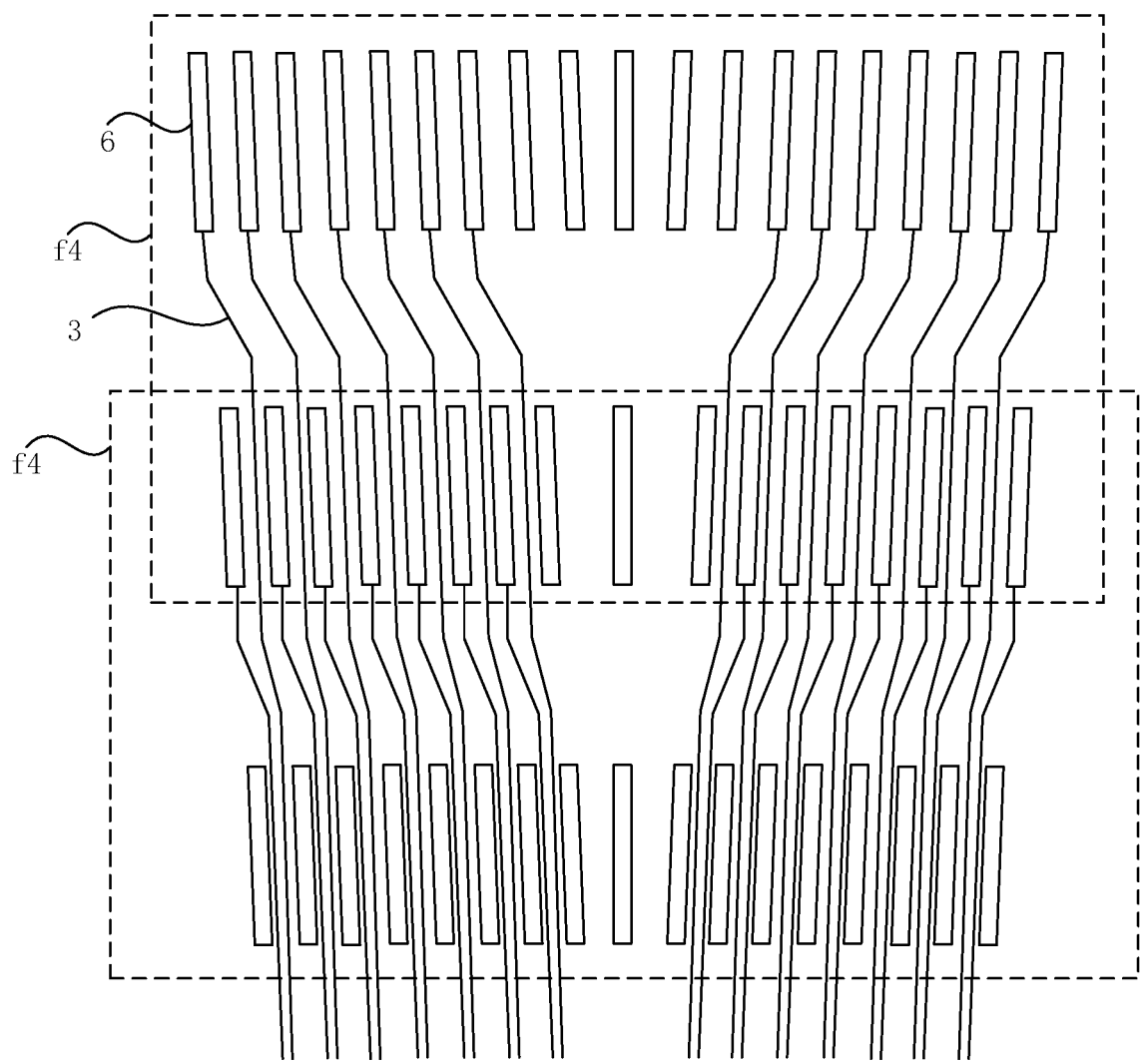
FIG. 10 is a schematic diagram of second pads and signal transmission lines electrically connected thereto in a display panel.

FIG. 10 is a schematic diagram of second pads and signal transmission lines electrically connected thereto in a display panel. As shown in FIG. 10, in the preceding technique, a relative position relationship between two adjacent rows of second pads 6 and a position relationship of the signal transmission lines 3 electrically connected to the second pads 6 are not particularly limited. In a distribution region f4 between any two adjacent rows of second pads 6 along the second direction YY', each of the signal transmission lines 3 electrically connected to the second pads 6 has at least two bending portions. The bending portion of the signal transmission line 3 is easily broken and thus the signal transmission is terminated when the flexible display panel or the flexible display panel bonded with the flexible structure is bent.

In embodiments of the present application, each second pad 6 in the (i+1)-th row includes a central point along the first direction XX', at least one equally-divided point is defined in a space between two adjacent second pads 6 in an i-th row, the at least one equally-divided point divides the space into m parts along the first direction XX', and the at least one equally-divided point includes a first setting equally-divided point. The central point, the first setting equally-divided point and the convergent point C are correspondingly located on a same straight line. That is, the central point of each second pad 6, the equally-divided points defined in a space, and the convergent point C are set regularly, which is conducive to reducing the designing difficulty of the second pads 6 in the display panel and the wiring difficulty of the signal transmission lines 7 electrically connected to the second pads 6. At the same time, in a distribution region between the second pads 6 in the (i+1)-th row and the second pads 6 in the i-th row along the second direction YY', the signal transmission lines 7 electrically connected to the second pads 6 in the (i+1)-th row are straight lines, so that a number of three-dimensional bending positions existing in the signal transmission lines 7 electrically connected to the second pads 6 can be reduced, a probability that the signal transmission lines 7 are broken and thus the signal transmission is interrupted when the display panel or the flexible display panel bonded with the flexible structure is bent can be reduced, and thus the yield and the reliability of the display panel can be improved.

In some embodiments, in conjunction with FIGS. 5 and 6 and FIGS. 8 and 9, each of the signal transmission lines 7 electrically connected to second pads 6 in an (i+2)-th row is routed through a second setting equally-divided point of the at least one equally-divided point arranged along the first direction XX' and defined in a space between two adjacent second pads 6 in the i-th row, where n is greater than 2, i is less than n−1, and m is equal to (n−i+1). For example, in a case that n is equal to 3 is taken as an example, that is, the display panel includes three rows of second pads 6, i is equal to 1, and each of the signal transmission lines 7 electrically connected to the second pads 6 in the third row is routed through a second setting equally-divided point of the only two equally-divided points which divides the space into three parts arranged along the first direction XX' and defined in a space between two adjacent second pads in the first row. The at least one equally-divided point includes only two equally-divided points which divides the space into three parts, one of the only two equally-divided points may be selected as the first setting equally-divided point, the other one of the only two equally-divided points is selected as the second setting equally-divided point. In FIGS. 5 and 8, one of the only two equally-divided points which is away from the reference line CC' may be selected as the first setting equally-divided point E, the other one of the only two equally-divided points which is adjacent to the reference line CC' is the second setting equally-divided point H. Alternatively, as shown in FIGS. 6 and 9, one of the only two equally-divided points which is adjacent to the reference line CC' may be selected as the first setting equally-divided point E, the other one of the only two equally-divided points which is away from the reference line CC' is the second setting equally-divided point H.

In this manner, in a distribution region between the second pads 6 in the (i+1)-th row and the second pads 6 in the i-th row along the second direction YY', the signal transmission lines 7 electrically connected to the second pads 6 in the (i+1)-th row are straight lines. In this manner, a number of bending positions existing in the signal transmission lines 7 electrically connected to the second pads 6 can be reduced, so that the probability that the signal transmission lines 7 are broken and thus the signal transmission is interrupted when the flexible display panel is bent can be reduced, and the yield and reliability of the display panel can be improved. At the same time, the signal transmission lines 7 electrically connected to different second pads 6 do not affect each other, and it is ensured that the flexible structure accurately transmits signals to the flexible display panel.

Figure 11:
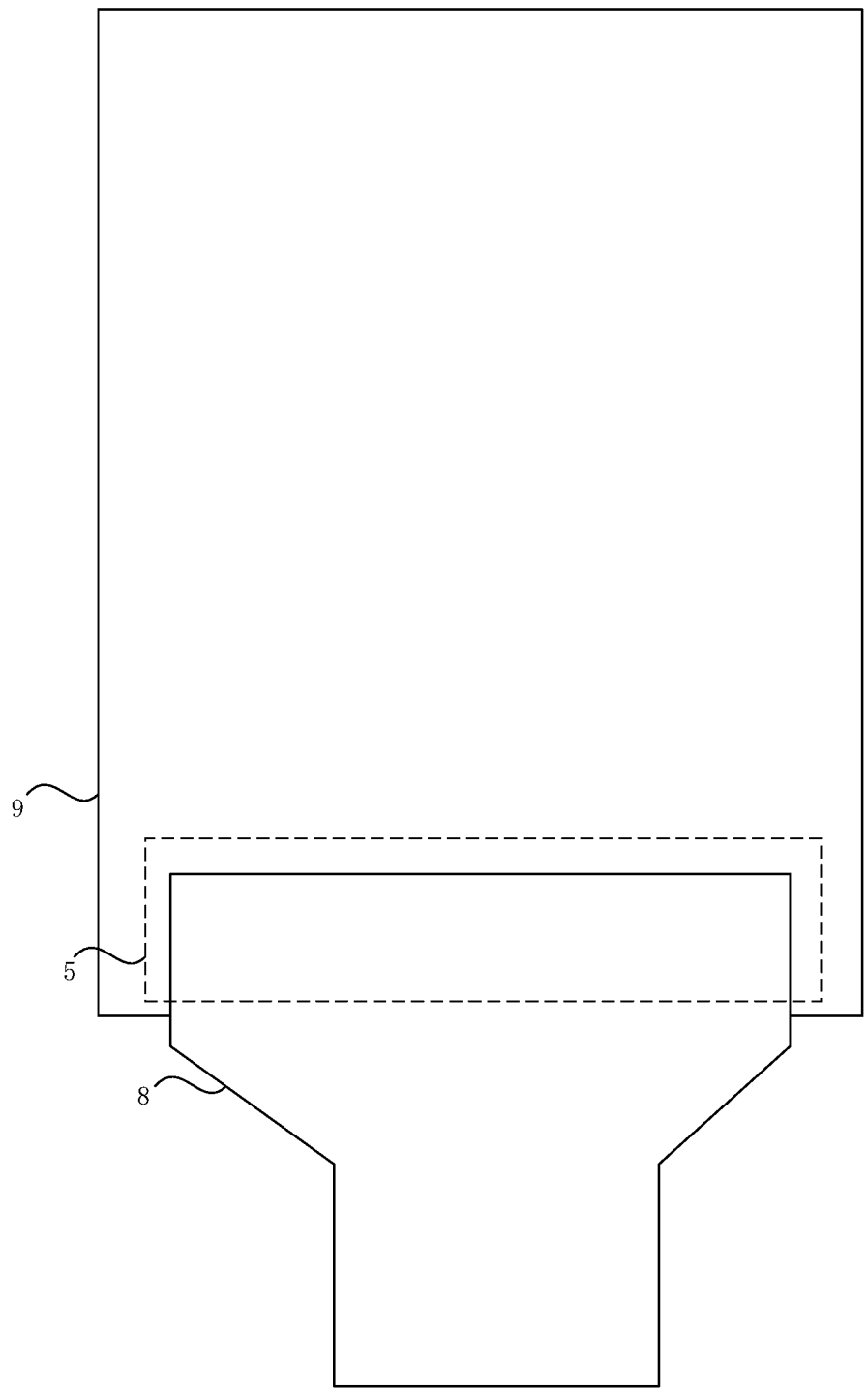
FIG. 11 is a schematic top view of a display apparatus according to an embodiment of the present application.

Embodiments of the present application further provide a display apparatus. FIG. 11 is a schematic top view of a display apparatus according to an embodiment of the present application. As shown in FIG. 11, the display apparatus includes a flexible structure 8 described in the preceding embodiments and a display panel 9 described in the preceding embodiments. In conjunction with FIGS. 1 to 11, the flexible structure 8 is bonded to the bonding region 5 of the display panel 9, and each first pad 2 in the flexible structure 8 is electrically connected to a respective second pad 6 in the bonding region 5 of the display panel 9, and the flexible structure 8 transmits corresponding display signals to the display panel 9 through the first pads 2 and the second pads 5. For example, the display apparatus may be an organic light-emitting diode (OLED) display apparatus, a micro light-emitting diode (micro LED) display apparatus, or a liquid crystal display apparatus, etc. The display apparatus may be a terminal equipment, such as a mobile phone, a computer, or other terminal equipment.

It is to be noted that FIG. 11 merely illustrates that the bonding method between the display panel and the driver IC chip is a COF bonding method, that is, the driver IC chip is disposed in the COF, and then the COF bonded with the driver IC chip is bonded to the bonding region of the display panel; or the bonding method between the display panel and the driver IC chip is an FPCB bonding method, that is, the driver IC chip is disposed in the bonding region of the display panel, and then the FPCB is bonded to the bonding region of the display panel. Alternatively, the bonding method between the display panel and the driver IC chip is a chip on plastic (COP) bonding method, that is, a flexible display substrate that constitutes the display panel is made of a bendable material. The flexible display substrate may be configured to be bonded with a driver chip, and the flexible display substrate and the FPCB are bent to a back of the display panel. Embodiments of the present application do not limit the bonding method between the display panel and the driver IC chip.

What is claimed is:

1. A flexible structure, comprising:
a substrate; and
n rows of first pads arranged on a side of the substrate, wherein the first pads in each row are arranged along a first direction, a virtual extension line of the first pads extends in an oblique direction with respect to a reference line extending along a second direction, virtual extension lines of all first pads intersect at a same convergent point, the first direction and the second direction are perpendicular to each other, each first pad in an (i+1)-th row comprises a central point along the first direction, at least one equally-divided point is defined in a space between two adjacent first pads in an i-th row, the at least one equally-divided point divides the space into m parts along the first direction, the at least one equally-divided point comprises a first setting equally-divided point, the central point of the first pad in the (i+1)-th row, the first setting equally-divided point defined in the space between two adjacent first pads in the i-th row, and the convergent point are correspondingly located on a same straight line, n is 3, i is a positive integer, i is less than n, m is equal to (n−i+1), compared to the (i+1)-th row, the i-th row is closer to the convergent point, and a number of first pads in the i-th row is less than a number of first pads in the (i+1)-th row, each first pad in a third row comprises a central point along the first direction, at least one equally-divided point is defined in a space between two adjacent first pads in a second row, the at least one equally-divided point divides the space into two parts along the first direction, the at least one equally-divided point comprises a first setting equally-divided point, the central point of the first pad in the third row, the first setting equally-divided point defined in the space between two adjacent first pads in the second row, and the convergent point are correspondingly located on a same straight line; each first pad in the second row comprises a central point along the first direction, at least one equally-divided point is defined in a space between two adjacent first pads in a first row, the at least one equally-divided point divides the space into three parts along the first direction, the at least one equally-divided point comprises a first setting equally-divided point, the central point of the first pad in the second row, the first setting equally-divided point defined in the space between two adjacent first pads in the first row, and the convergent point are correspondingly located on a same straight line.

2. The flexible structure of claim 1, wherein along the first direction, the first pads in each row are symmetrically arranged relative to the reference line.

3. The flexible structure of claim 1, wherein each first pad has a length along the second direction and lengths of the first pads in a same row are identical.

4. The flexible structure of claim 1, comprising:
at least one chip on film (COF) or at least one flexible printed circuit board (FPCB).

5. The flexible structure of claim 1, wherein the virtual extension line of the first pad is parallel to an extending direction of the first pad, the first pad in each row comprises the central point along the first direction, and the virtual extension line of the first pad passes through the central point of the first pad.

6. A display panel, comprising:
a flexible display substrate; and
n rows of second pads arranged in a bonding region of the flexible display substrate, the bonding region located on a side of the flexible display substrate, the second pads in each row are arranged along a first direction, a virtual extension line of the second pads extends in an oblique direction with respect to a reference line extending along a second direction, virtual extension lines of all second pads intersect at a same convergent point, the first direction and the second direction are perpendicular to each other, each second pad in an (i+1)-th row comprises a central point along the first direction, at least one equally-divided point is defined in a space between two adjacent second pads in an i-th row, the at least one equally-divided point divides the space into m parts along the first direction, the at least one equally-divided point comprises a first setting equally-divided point, the central point of the second pad in the (i+1)-th row, the first setting equally-divided point defined in a space between two adjacent second pads in the i-th row, the convergent point are correspondingly located on a same straight line, n is 3, i is a positive integer, i is less than n, and m is equal to (n−i+1), compared to the second pad in row (i+1)-th, the second pad in row (i+1)-th is closer to the convergent point, and a number of second pads in the i-th row is less than a number of second pads in the (i+1)-th row, signal transmission lines electrically connected to the second pads in the (i+1)-th row are straight lines in a distribution region between the second pads in the (i+1)-th row and the second pads in the i-th row, each of the signal transmission lines electrically connected to the second pad in an (i+2)-th row runs through a second setting equally-divided point of the at least one equally-divided point arranged along the first direction and defined in the space between two adjacent second pads in the i-th row, each second pad in a third row comprises a central point along the first direction, at least one equally-divided point is defined in a space between two adjacent second pads in a second row, the at least one equally-divided point divides the space into two parts along the first direction, the at least one equally-divided point comprises a first setting equally-divided point, the central point of the second pad in the third row, the first setting equally-divided point defined in the space between two adjacent second pads in the second row, and the convergent point are correspondingly located on a same straight line; each second pad in the second row comprises a central point along the first direction, at least one equally-divided point is defined in a space between two adjacent second pads in a first row, the at least one equally-divided point divides the space into three parts along the first direction, the at least one equally-divided point comprises a first setting equally-divided point, the central point of the second pad in the second row, the first setting equally-divided point defined in the space between two adjacent second pads in the first row, and the convergent point are correspondingly located on a same straight line.

7. The display panel of claim 6, wherein along the first direction, the second pads in each row are symmetrically arranged relative to the reference line.

8. The display panel of claim 6, wherein each second pad has a length along the second direction and lengths of the second pads in a same row are identical.

9. The display panel of claim 6, wherein the virtual extension line of the second pad is parallel to an extending direction of the second pad, the second pad in each row comprises the central point along the first direction, and the virtual extension line of the second pad passes through the central point of the second pad.

10. The display panel of claim 6, wherein a row of second pads adjacent to the convergent point is referred to as a first row of second pads, and a row of second pads away from the convergent point is referred to as a second row of second pads.

11. The display panel of claim 6, wherein a distance between the second pads in a first row and the convergent point, a distance between the second pads in a second row and the convergent point, and a distance between the second pads in a third row and the convergent point are in an ascending order, when n=3 and i=1, the signal transmission lines electrically connected to the second pads in the second row are straight lines in a distribution region between the second pads in the second row and the second pads in the first row; and when n=3 and i=2, the signal transmission lines electrically connected to the second pads in the third row are straight lines in a distribution region between the second pads in the third row and the second pads in the second row.

12. A display apparatus, comprising the flexible structure of claim 1 and the display panel of claim 6, wherein the flexible structure is bonded to a bonding region of the display panel, and each first pad in the flexible structure is electrically connected to a respective second pad in the bonding region of the display panel.

13. The display apparatus of claim 12, further comprising:
an organic light-emitting diode (OLED) display apparatus.

14. The display apparatus of claim 12, the display apparatus is a mobile phone.

* * * * *